United States Patent
Yamashita

(10) Patent No.: US 6,872,646 B2
(45) Date of Patent: Mar. 29, 2005

(54) METHOD FOR MANUFACTURING CONDUCTIVE PATTERN SUBSTRATE

(75) Inventor: Yudai Yamashita, Shinjuku-ku (JP)

(73) Assignee: Dia Nippon Printing Co., Ltd., Tokyo (JP)

(*) Notice: Subject to any disclaimer, the term of this patent is extended or adjusted under 35 U.S.C. 154(b) by 0 days.

(21) Appl. No.: 10/453,392

(22) Filed: Jun. 3, 2003

(65) Prior Publication Data

US 2004/0081921 A1 Apr. 29, 2004

(30) Foreign Application Priority Data

Jun. 7, 2002 (JP) .................................. 2002-166404

(51) Int. Cl.⁷ .............................................. H01L 21/20
(52) U.S. Cl. ...................... 438/584; 438/597; 438/616; 438/669; 438/671; 438/942; 438/945; 438/948
(58) Field of Search .................. 438/584, 597–598, 438/616, 669–671, 942, 945, 948–951

(56) References Cited

U.S. PATENT DOCUMENTS

| | | | | |
|---|---|---|---|---|
| 5,447,767 A | * | 9/1995 | Tanabe et al. | 428/64.4 |
| 5,492,863 A | * | 2/1996 | Higgins, III | 438/610 |
| 5,981,866 A | * | 11/1999 | Edelson | 136/256 |
| 6,063,701 A | * | 5/2000 | Kuwazaki et al. | 438/616 |
| 6,239,356 B1 | * | 5/2001 | Edelson | 136/256 |
| 6,645,856 B2 | * | 11/2003 | Tanaka et al. | 438/671 |
| 6,653,232 B2 | * | 11/2003 | Uda et al. | 438/669 |

* cited by examiner

*Primary Examiner*—Lynne A. Gurley
(74) *Attorney, Agent, or Firm*—Timothy J. Keefer; Seyfarth Shaw LLP

(57) ABSTRACT

A conductive pattern is obtained by forming concave-convex on a substrate by using a pattern substrate. A conductive thin layer is formed and then coated with a layer of a photosensitive resin. The photo sensitive resin is exposed and development by using the pattern substrate to bare the conductive thin layer on the convex portion and electrolytic plating. The conductive thin layer and the layer of the photosensitive resin on the concave portion may then be removed.

5 Claims, 3 Drawing Sheets

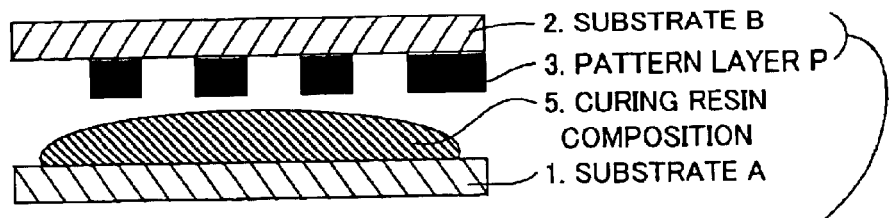

FIG. 1A

2. SUBSTRATE B
3. PATTERN LAYER P
5. CURING RESIN COMPOSITION
1. SUBSTRATE A
4. PATTERN SUBSTRATE C

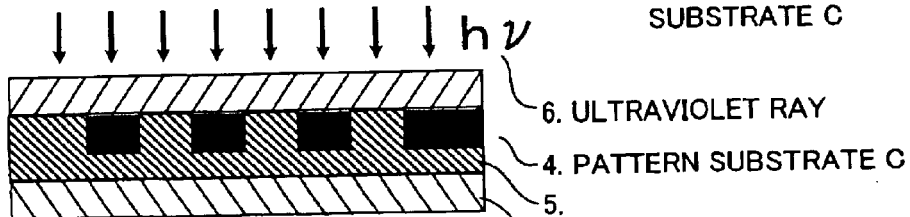

FIG. 1B

6. ULTRAVIOLET RAY
4. PATTERN SUBSTRATE C
5.
1.

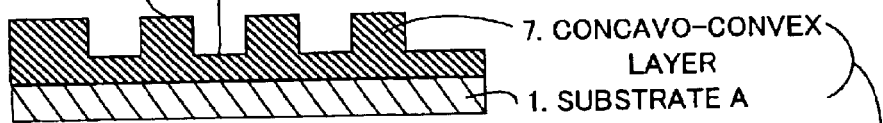

FIG. 1C

7a. CONVEX PORTION
7b. CONCAVE PORTION
7. CONCAVO-CONVEX LAYER
1. SUBSTRATE A
8. CONCAVO-CONVEX LAMINATED BODY

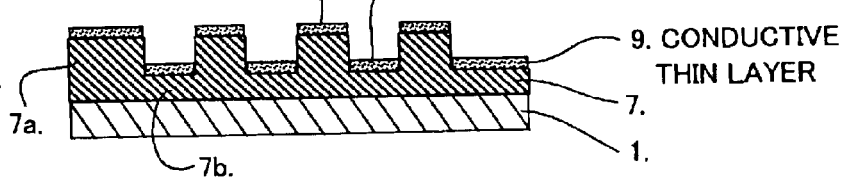

FIG. 2A

9a. CONDUCTIVE THIN LAYER
9b. CONDUCTIVE THIN LAYER
9. CONDUCTIVE THIN LAYER
7.
1.
7a.
7b.

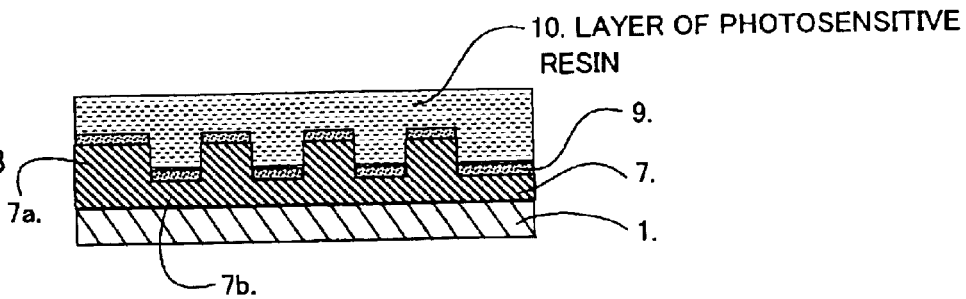

FIG. 2B

10. LAYER OF PHOTOSENSITIVE RESIN
9.
7.
1.
7a.
7b.

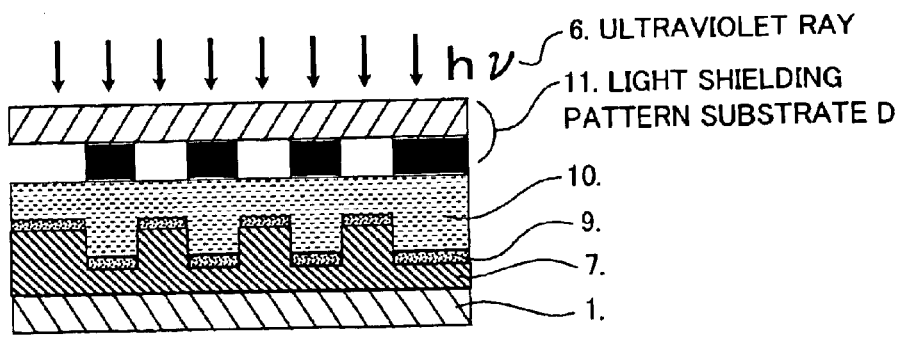

FIG. 2C

6. ULTRAVIOLET RAY
11. LIGHT SHIELDING PATTERN SUBSTRATE D
10.
9.
7.
1.

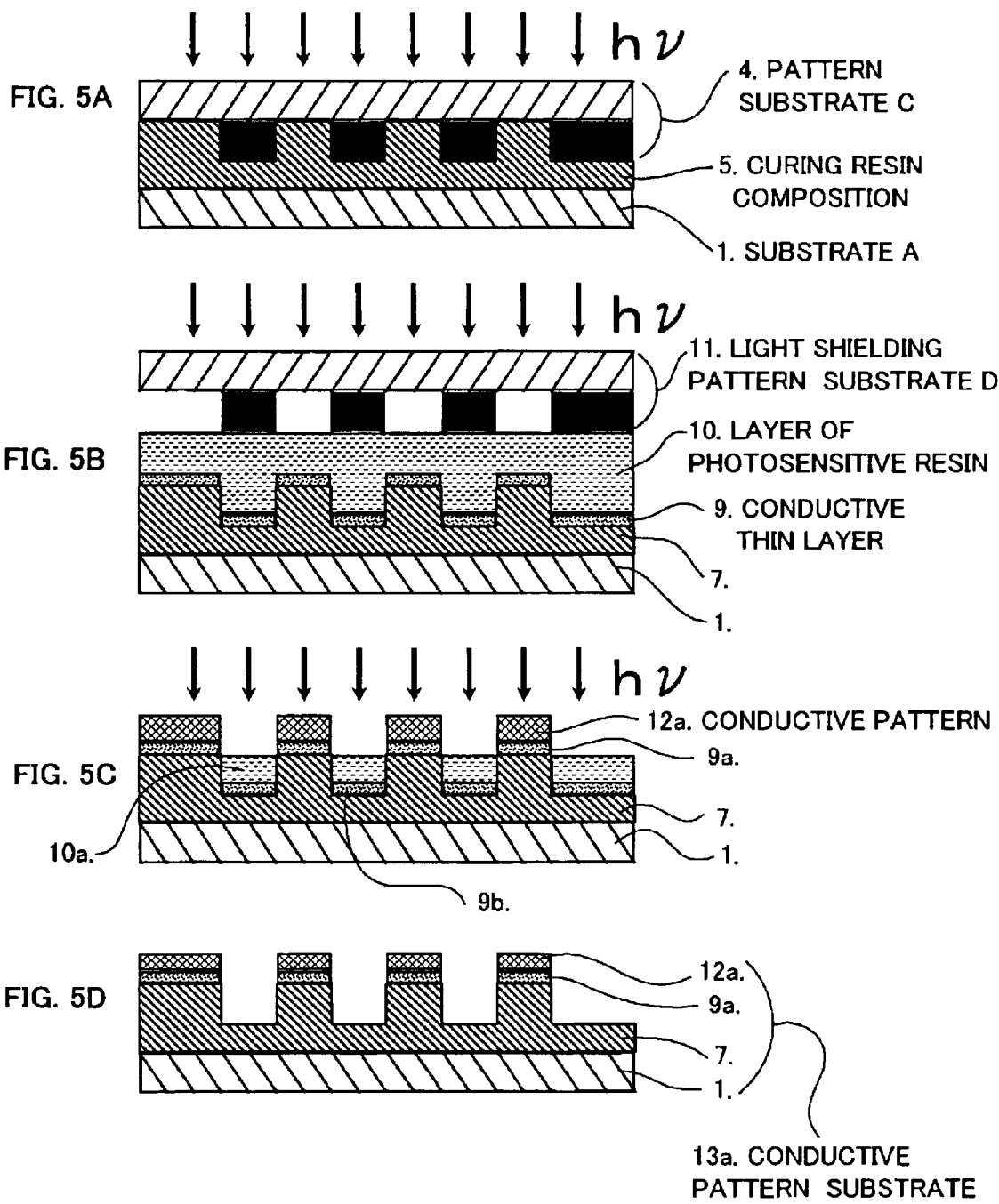

METHOD FOR MANUFACTURING CONDUCTIVE PATTERN SUBSTRATE

BACKGROUND OF THE INVENTION

1. Field of the Invention

The present invention relates to a method for manufacturing a substrate having a conductive pattern, and more specifically to a method of forming a conductive pattern through utilization of a concave-convex layer on a substrate.

2. Description of the Related Art

One method for forming a metal conductive pattern on the surface of a substrate is referred to herein as a "subtractive method". In this method, a metal layer is provided on the substrate, a photoresist layer is laminated thereon, a resist pattern is formed by pattern exposing and developing, and then the resulting structure is etched. Difficulties with this process are twofold: Since most of the metal utilized is generally removed from the substrate, the metal must be recovered, and it is necessary to treat a large amount of etching effluent.

In another method, referred to here as "a full-additive method" a plating resist pattern is provided on a portion of a substrate, and a metal pattern is provided, by electroless plating, on the portion not coated with the plating resist pattern. Alternatively, there is a semi-additive method, a plating resist pattern is provided on a portion of a metal layer provided by electroless plating on a substrate or the like; and a metal pattern is then provided by electrolytic plating on the portion which is not coated with the plating resist pattern. Because a metal layer can be provided pattern-wise in both the full-additive method and semi-additive method, the drawbacks of the aforementioned subtractive method are eliminated.

However, in the full-additive method and the semi-additive method, although the metal pattern is determined by the shape of an opening portion of the plating resist pattern, the metal pattern grows by plating. Accordingly, it is difficult in these methods to form a square sectional shape and to obtain a constant line width.

In another method, disclosed in Japanese Patent Application Laid-Open (JP-A) No. 2000-265087, a pattern is printed by conductive ink on a transparent base material, coated with a negative type photoresist layer that is thicker than the pattern, exposed to light from the backside of the base material, developed to remove the photoresist layer on the pattern, and then a metal pattern is formed on the pattern by electrolytic plating. In this method, however, since the first pattern is formed by printing, it is difficult to secure dimensional accuracy and positional accuracy at a high level.

SUMMARY OF THE INVENTION

An object of the present invention is to address the drawbacks associated with the conventional full-additive method, semi-additive method, and the printing method.

The above object can be achieved by the following processes. As shown schematically in FIG. 5D, instead of the formation of a plating resist pattern and the formation of a conductive ink pattern in the conventional method, a concave-convex layer 7, is formed on a substrate 1. Referring to FIG. 5A, to form the concave-convex layer a a curing resin composition 5 is formed on the substrate 1. A concave-convex pattern substrate 4 is applied to the surface of curing resin composition 5. Then, through a series of steps further discussed herein, concave-convex layer 7 is formed. Then, referring to FIG. 5B, a conductive thin layer 9 is formed on the entire surface by vapor deposition or the like. The whole surface is then coated with a layer of the photosensitive resin 10 and exposed using the pattern substrate 4 as a light shielding pattern substrate. In one example, the conductive thin layers 9a on the convex portions are selectively exposed, and the bared conductive thin layers 9a are plated. Whereby a conductive pattern substrate 13a having a conductive pattern 12a with a good sectional shape and a line width is obtained.

In one embodiment, a method for manufacturing a conductive pattern substrate is disclosed; wherein four processes are carried out in sequence: First, the concave-convex layer is formed on a substrate. The layer comprises concave portions corresponding to portions with a light shielding layer of the pattern layer later used and a convex portions corresponding to non-light shielding portions on the pattern layer. A substrate is laminated on a pattern substrate. The pattern layer comprises laminated parts and non-laminated parts, is laminated. The curing resin composition is interposed between the substrate and the pattern substrate before or after the lamination of the pattern substrate and the substrate. The curing resin composition is cured and the pattern substrate is peeled; Second, a process of forming a conductive thin layer on the concave-convex layer is performed. The process is performed by a gas phase method. The conductive thin layer is formed on the bottom of the concave portion of the concave-convex layer and on the top of the convex portion of the concave-convex layer; Third, a process is performed to laminate a photosensitive resin composition layer on the resulting structure, such that the concave-convex is flattened. The laminated photosensitive resin composition layer is exposed by a light shielding pattern substrate D having the same pattern as the pattern substrate. After the exposure the photosensitive resin composition layer is exposed to remove the photosensitive resin composition layer laminated on either of the bottom of the concave portion or the top of the convex portion, thereby baring the conductive thin layer; Fourth, a process is performed for forming a conductive pattern by plating the bared layer of the conductive thin layer with a metal.

In a second embodiment a method for manufacturing a conductive pattern substrate according to the first invention is disclosed. The photosensitive resin composition is a positive type. After conducting the process of forming a conductive pattern, a fifth process is performed whereby the entire surface of the photosensitive resin composition layer is exposed, and etching is carried out after the exposure of the entire surface to remove the photosensitive resin composition layer on the conductive thin layer of the concave portion.

In a third embodiment a method for manufacturing a conductive pattern substrate according to the second embodiment is disclosed. The conductive thin layer on the concave portion is removed in addition to the removal of the photosensitive resin composition layer on the concave portion.

In a fourth embodiment a method for manufacturing a conductive pattern substrate according to the first embodiment is disclosed. The photosensitive resin composition used is a negative type the process of forming a conductive pattern, a process is conducted the photosensitive resin composition layer on the conductive thin layer of the convex portion is removed by etching.

In a fifth embodiment, a method for manufacturing a conductive pattern substrate according to the fourth embodiment is disclosed. In the process, the conductive thin layer on the convex portion is removed in addition to the removal of the photosensitive resin composition layer on the convex portion.

According to the first embodiment, the formation of concave-convex layer and the selective removal, of the conductive thin layer formed on the concave-convex layer, are carried out by using a pattern having the same plane shape. Therefore, the pattern of the conductive thin layer, which is a base when the conductive pattern is formed, is reproduced to the pattern substrate. Therefore, a method for manufacturing a conductive pattern substrate capable of forming a highly precise conductive pattern is provided.

According to the second embodiment, in addition to the effect of the first embodiment, since the photosensitive resin composition is a positive type, the photosensitive resin composition on the convex portion and on the concave portion is solubilized by exposure so that it is easy to remove selectively. Therefore, a method for manufacturing a conductive pattern substrate capable of forming highly precise conductive pattern only on the convex portion is provided.

According to the third embodiment, in addition to the effect of the second embodiment, a method for manufacturing a conductive pattern substrate is provided, wherein the conductive thin layer on the bottom of the concave portion is also removable.

According to the fourth embodiment, in addition to the effect of the first embodiment, since the photosensitive resin composition is a negative type, a method for manufacturing a conductive pattern substrate is provided, wherein an unexposed photosensitive resin composition on the concave portion can be removed selectively with ease, so that a highly precise conductive pattern can be formed only on the concave portion.

According to the fifth embodiment, in addition to the effect of the fourth embodiment, a method for manufacturing a conductive pattern substrate is provided wherein the conductive thin layer on the top of the convex portion can also be removed.

BRIEF DESCRIPTION OF THE DRAWINGS

FIG. 1 is a view showing a process for manufacturing a substrate, a pattern substrate and a concave-convex laminated body.

FIG. 2 is a view showing a process of forming a conductive thin layer and a process of laminating and exposing a photosensitive resin composition layer.

FIG. 5 is a view showing the outline of a manufacturing method in the present invention.

DESCRIPTION OF THE PREFERRED EMBODIMENT

Figure 3A:
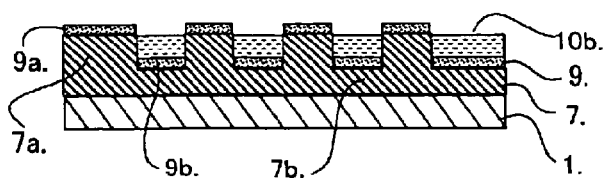
FIG. 3 is a view showing a process of forming a conductive pattern in the case of using a positive type photosensitive resin.

FIGS. 1 to 4 are views showing each process in an exemplary method of manufacturing a substrate having a conductive pattern As will be mentioned later, the order of the processes, shown in the figures, is classified into two types depending on the type of photosensitive resin composition used. Namely, the order is FIG. 1→FIG. 2→FIG. 3 or FIG. 1→FIG. 2→FIG. 4.

Referring to FIG. 1, first, a substrate is prepared. The substrate 1 constitutes a circuit substrate and the like, and can be formed from an inorganic base material, such as glass, a silicon or quartz, or an organic base material, including but not limited to, polyamide, polyacetal, polybutylene terephthalate, polyethylene terephthalate, polyethylene naphthalate, or syndiotactic polystyrene or the like, polyphenylene sulfide, polyether ether ketone, a liquid crystal polymer, fluorine resin, or polyether nitrile, polycarbonate, denatured polyphenylene ether, polycyclohexene, or polynorbornane type resin, or the like, or polysulfone, polyether sulfone, polyarylate, polyamideimide, polyether imide, or thermoplastic polyimide. Base materials made of typical plastics may also be used. Particularly, in the case where the substrate 1 is an organic base material, the use of a thin, flexible, film formed material having a thickness of about 5 $\mu$cm to 300 $\mu$m is desirable because the resulting substrate having a conductive pattern can be made flexible.

Next, a pattern substrate 4 is prepared. Pattern substrate 4 comprises a pattern layer 3 laminated on substrate 2. The material constituting substrate is principally the same as that constituting the substrate. However, as will be mentioned later, because the pattern substrate 4 is used as a mask pattern when exposing a photosensitive resin composition layer, substrate 2 is preferably transparent to exposing light. Although the thickness of the substrate 2 is unprescribed, the substrate 2 is preferably enough to provide dimensional stability. The thickness of the substrate 2 is about 1 mm to 5 mm if the substrate 2 is made of glass or quartz among the aforementioned inorganic base materials, and about 50 $\mu$m to 300 $\mu$m if the substrate 2 is made of the aforementioned organic base material.

The pattern layer 3 constitutes from a patterned light shielding layer. The light shielding layer may be either a thin film layer of an inorganic material such as chromium, or a layer of a resin composition containing a light shielding agent, such as a dye and a pigment. When pattern layer is constituted by the presence and absence of a thin film layer of an inorganic material such as chromium, pattern layer 3 may be formed by using the same photoetching method used for manufacturing a semiconductor photomask. The formation of the pattern layer 3 may also be carried out by subjecting a photosensitive resin layer, formed on a base material by coating or lamination, to pattern exposure and developing.

In this example, the pattern layer 3 is constituted of a part where the light shielding layer is present and a part where the light shielding layer is not present. When a layer of a photosensitive resin used afterwards is a positive type, the pattern layer 3 is structured such that the part where the light shielding layer is not present has a conductive pattern shape. Supposing that the pattern substrate 4 only serves as a mask pattern substrate, the thickness of the light shielding layer may be very thin. However, in the pattern substrate 4 used in the present invention, the thickness of the light shielding layer determines the depth of the concave portion of the concave-convex layer 7 formed on the substrate 1. The thickness of the light shielding layer is therefore preferably about 10 nm to 1 $\mu$m. The widths of the part where the light shielding layer is present and the part where the light shielding layer is not present are also preferably 10 nm to 1 $\mu$m, which is the same as the thickness. Also, the sectional shape of each part of the pattern layer 3 is preferably as close to square as possible. Even if the corner portion of the sectional shape is rounded, the curvature radius r of the round corner is preferably 1/10 or less of the thickness of the light shielding layer.

Pattern layer is characterized by the presence and absence of the light shielding layer, because pattern substrate 4 is also used when the photosensitive resin composition is subjected to pattern exposure in the subsequent process. However, if the pattern substrate 4 is only used when deciding the depth of the concave portion of the concave-convex layer formed on the substrate 1, and if a different pattern substrate is used in the subsequent pattern exposure of the photosensitive resin composition, the pattern layer 3 may be constituted of a light transmitting layer, not of a light shielding layer. If the pattern layer 3 constitutes a light transmitting layer, light is transmitted through the pattern layer 3 when exposed from the substrate 2 side of the pattern substrate 4, and it is therefore possible to cure the curing resin placed in between the substrate 1 and the pattern substrate 4 by irradiating light from the pattern substrate 4 side.

The substrate 1 and the pattern substrate 4 are laminated on each other such that the pattern layer 3 is on the substrate 1 side, and also the curing resin composition 5 is interposed between the both. Alternatively, a material other than a curing resin composition can be interposed between the substrates. However, it is preferable to use a curing resin composition having high heat resistance and other durability in consideration of the heat applied when a metal thin layer is formed in the subsequent process and the use of a substrate having a conductive pattern.

Examples of the curing resin composition are a curing resin by itself, or mixtures of curing resins such as an unsaturated polyester, melamine, epoxy, polyester (meth) acrylate, urethane (meth) acrylate, epoxy (meth) acrylate, polyether (meth) acrylate, polyol (meth) acrylate, melamine (meth) acrylate, triazine type acrylate, and the like. A curing agent, a photo polymerization initiator, and the like may be added to these curing resin compositions according to the need. These curing resin compositions may be used as curing resin compositions of thermosetting resin compositions or ionizing radiation curing resin compositions such as ultraviolet curing resin compositions or the like. The curing resin composition preferably has a viscosity suitable for coating and it is preferable to adjust the viscosity by compounding a solvent or a monomer.

The lamination of the substrate 1 and the pattern substrate 4 via the curing resin composition 5 can be carried out by coating the curing resin composition 5 on, either or both, the surface of the substrate 1 and the pattern layer 3 side of the pattern substrate 4 and laminating the two together, or fixing the both with a space between and then injecting the curing resin composition 5 in the space.

After laminating the substrate 1 and the pattern substrate 4 via the curing resin composition 5, the curing resin composition 5 is cured. When a thermosetting resin composition is used, it is cured by allowing it to stand for the required curing time at a normal temperature or a temperature elevated through heating when an ionizing radiation curing resin composition, such as ultraviolet ray curing resin composition, is used, it is cured by irradiating it with ionizing radiation such as ultraviolet rays 6. When the curing is carried out by irradiating ionizing radiation, the radiation is irradiated from the ionizing radiation transmitting substrate side among the substrate 1 and the pattern substrate 4. In other words, if substrate 1 constitutes an ionizing radiation transmitting raw material and ultraviolet rays are irradiated, substrate 1 constitutes a transparent material, and when the substrate 4 constitutes the pattern substrate 2 and the pattern layer 3, which are an ionizing radiation transmitting raw material, and ultraviolet rays are irradiated, both pattern substrate 2 and pattern layer 3 are a transparent material. If electron rays are irradiated, since the penetrability of electron rays is relatively high, transparency is not necessary required and the respective layers are not limited to transparent materials, provided the transmit electron rays.

After curing the curing resin composition interposed between the substrate 1 and the pattern substrate 4, the pattern substrate 4 is peeled off to thereby obtain an concave-convex laminated body 8 in which a concave-convex layer 7, constituted of a convex portion 7a, corresponding to the portion of the pattern layer P where the light shielding layer is not present, and a concave portion 7b, corresponding to the portion of the pattern layer P where the light shielding layer is present, and which is constituted of the cured product of the curing resin composition, is laminated on the substrate A. The concave-convex layer 7, as shown in FIGS. 3A–3D, may be one continuous layer as a whole, with thin concave portion, or there may be no cured product of the curing resin composition in the concave portion 7b. In the latter case, the total thickness of the concave-convex layer 7 is about 10 nm to 1 $\mu$m which is the thickness of the light shielding layer, and in the former case, the total thickness of the concave-convex layer 7 is about 100 nm to 10 $\mu$m.

As shown in FIG. 2A, conductive thin layers 9a and 9b are respectively formed on the bottom of the concave portion 7b and on the top of the convex portion 7a on the concave-convex layer 7 of the concave-convex laminated body 8, by a gas phase method such as a vapor deposition method or sputtering method. Since a raw material used to form thin layer a adheres in a more orientating manner in a gas phase method, as compared with a liquid phase method such as plating, the conductive thin layer 9 is not substantially formed on the side surface of the convex portion 7a.

The material constituting the conductive thin layer 9 can be a high conductive material, such as Fe, Ni, Cr, Cu, Ti, Hf, Zn, Zr, Mo, Ta, or the like. The conductive thin layer 9 may either be constituted of a single layer made of the same metal, or it may be constituted of two or more layers comprising metals differing from each other. For example, a highly adhesive thin layer of Cr can be formed on the concave-convex layer 7 made of the cured product of the photosensitive resin composition, and then a thin layer of Cu is formed. The thickness of the conductive thin film 9 constituted of the above metals is preferably about 20 nm to 500 nm.

A photosensitive resin composition layer 10 is laminated on the entire surface of the concave-convex layer 7, on which the conductive thin layer 9 is formed, so as to flatten the structure. In order to flatten the structure, the thickness of the photosensitive resin composition layer 10 should be higher than the height of the convex portion. Accordingly, the thickness of the photosensitive resin composition layer 10 is preferably about 10 nm to 20 $\mu$m.

Examples of the photosensitive resin composition include but are not limited to a positive type photosensitive resin, for example, a photolysis soluble type quinonediazide type photosensitive resin as a major component, or a negative type photosensitive resin comprising, for example, a photolysis crosslinking type azide type photosensitive resin, photolysis insoluble type diazo type photosensitive resin, photo dimerization type cinnamate type photosensitive resin, photo polymerization type unsaturated polyester type photosensitive resin, photo polymerization type acrylate resin or cationic polymerization type resin as a component. In addition to these photosensitive resin compositions, a photo polymerization initiator, sensitizing dyes and the like are added, as needed.

Referring to FIGS. 2B and 2C, the laminated photosensitive resin composition layer 10 is exposed via a light shielding pattern substrate having the same plane shape shielding pattern as the pattern substrate 4. It is preferable to use the pattern substrate 4 having a pattern layer constituted of a patterned light shielding layer, as the light shielding pattern substrate 11. However, in this case, since the light shielding pattern substrate 11 is used for pattern exposure, not for the purpose of forming concave-convex, thickness of the pattern layer is not necessary required. Therefore, the light shielding pattern substrate 11 may be one different from the pattern substrate 4 on which thin light shielding pattern layers are laminated; however, one with the same plane shape pattern as the pattern substrate 4 is used. In any case, the substrate 1 and the light shielding pattern substrate 11 are aligned such that the horizontal positional relationship of the light shielding pattern substrate 11, laminated on the photosensitive resin composition layer 10 to the substrate 1 is the same as the positional relationship of the former pattern substrate 4 to the substrate 1 when the pattern substrate 4 is used.

The exposure is carried out by irradiating with ultraviolet rays at 0.1 to 10,000 mJ/cm$^2$ and preferably 10 to 1,000 mJ/cm$^2$ using a light source such as an extra high pressure mercury lamp, high pressure mercury lamp, carbon arc, xenon arc or metal halide lamp or the like.

The exposed part is solubilized by the exposure when the photosensitive resin composition layer 10 contains a positive type photosensitive resin as its major component. Therefore, by developing after the exposure, the solubilized part of the photosensitive resin composition layer 10 on the convex portion 7a of the concave-convex layer 7 is dissolved and removed by a developer. As a consequence, the conductive thin layer 9a formed on the top of the convex portion 7a is bared, and the conductive thin layer 9b formed on the bottom of the concave portion 7b remains coated with the photosensitive resin composition layer 10b. This condition of development allows the photosensitive resin composition layer 10b on the concave portion 7b to be made thinner compared with the original photosensitive resin composition layer 10, and may be removed to an extent that the concave portion 7b is filled (FIG. 3A).

The exposed part is insolubilized by the above exposure when the photosensitive resin composition layer 10 contains a negative type photosensitive resin as its major component. Therefore, by developing after the exposure, the part of the photosensitive resin composition layer 10 on the concave portion 7b of the concave-convex layer 7, which is not insolubilized, is dissolved and removed by a developer. As a consequence, the conductive thin layer 9b formed on the bottom of the concave portion 7b is bared and the conductive thin layer 9a, formed on the top of the convex portion 7a, remains coated with the insolubilized photosensitive resin composition layer 10a.

Figure 3B:
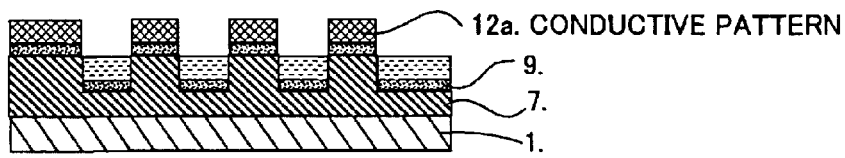
Figure 4A:
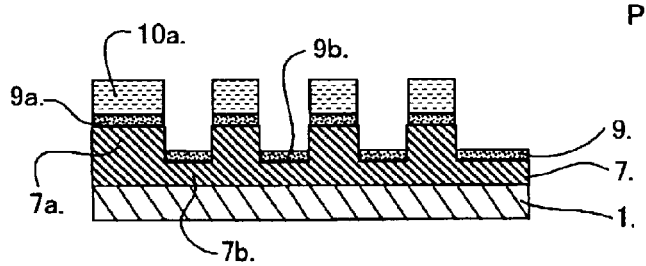
FIG. 4 is a view showing a process of forming a conductive pattern in the case of using a negative type photosensitive resin.
Figure 4B:
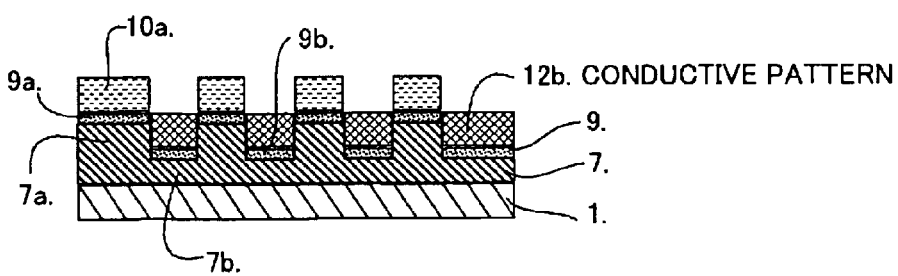

The conductive thin layer 9b on the top of the convex portion and the conductive thin layer 9b on the bottom of the concave portion, which are bared by the exposure and developing of the photosensitive resin composition layer 10, are subjected to electrolytic metal plating to form a conductive pattern 12a (FIG. 3B) or 12b (FIG. 4B).

The metal used to constitute the conductive patterns 12a and 12b is basically the same as those exemplified as the material constituting the conductive thin layer 9. Cu which has high conductivity is preferable, or it also may be gold, silver or the like. The thickness of the conductive patterns 12a and 12b is preferably 100 nm to 20 μm and more preferably about 1 μm to 10 μm though it depends on the line width or the degree of conductivity required.

Figure 4C:
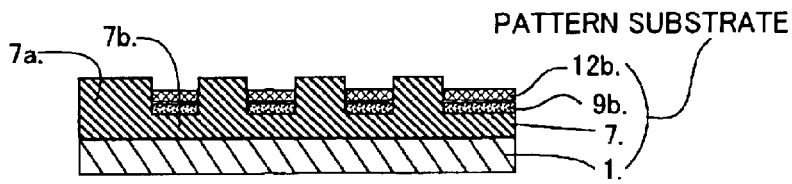

As shown in FIG. 4B, when the conductive thin layer 9b on the bottom of the concave portion 7b is plated with metal to form the conductive pattern 12b, the conductive thin layer 9a on the top of the convex portion 7a and the insolubilized photosensitive resin composition layer 10a on the conductive thin layer 9a remain. In the case where the conductive thin layer 9a is not necessary, the photosensitive resin composition layer 10a and the conductive thin layer 9a are etched one by one by changing an etching solution, or etched by using an etching solution capable of removing both, thereby obtaining conductive pattern substrate 13b, from which the conductive thin layer 9a on the top of the convex portion 7a and the photosensitive resin composition layer 10a are removed (FIG. 4C). When removing the conductive thin film 9a on the top of the convex portion 7a and the photosensitive resin composition layer 10a, the conductive pattern 12b is also affected, and therefore the conductive pattern 12b may become thinner than when it is formed. The thickness of the aforementioned conductive pattern 12b is preferably determined by calculating backwards from the thickness required for the final conductive pattern substrate 13b, considering that the conductive pattern becomes thinner as mentioned above.

Figure 3C:
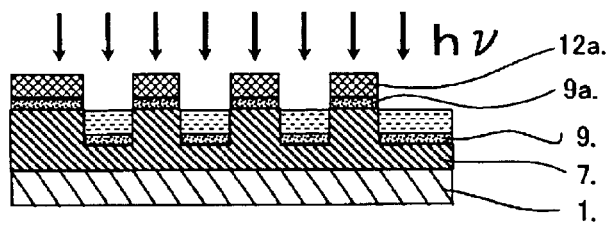
Figure 3D:
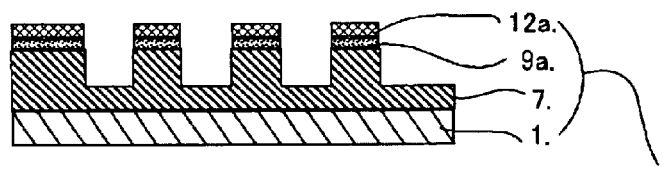

As shown in FIG. 3B, when forming the conductive pattern 12a by plating metal to the conductive thin layer 9b on the convex portion 7a, the conductive thin film layer 9b and the photosensitive resin composition layer 10b, which is difficult to dissolve and remove, are laminated on the bottom of the concave portion 7b. To remove if they are not necessary, an exposure is first carried out from the side on which the photosensitive resin composition layer 10b is laminated, to solubilize the photosensitive resin composition layer 10b (FIG. 3C). Then the solubilized photosensitive resin composition layer 10b and the conductive thin layer 9b are etched one by one by changing an etching solution, or etched by using an etching solution capable of removing the both, thereby obtaining a conductive pattern substrate 13a (FIG. 3D), from which the conductive thin layer 9b and the photosensitive resin composition layer 10b on the bottom of the concave portion 7b are removed. In this case, the conductive pattern 12a is also affected and possibly becomes thinner. Therefore, the thickness of the aforementioned conductive pattern 12a is preferably determined by calculating backwards from the thickness required for the final conductive pattern substrate 13a.

When the conductive pattern 12a is formed on the convex portion 7a, as shown in FIGS. 4A and 4B, the conductive thin layer 9b remains on the bottom of the concave portion 7b, whereas when the conductive pattern 12b is formed on the concave portion 7b, the conductive thin layer 9a remains on the top of the convex portion 7a. This may be used as a conductive pattern substrate, as it is. However, because a small amount of the conductive thin layer might adhere to the side surface of the convex portion 7a, when the conductive thin film is formed in the previous process, there is a risk that the conductive thin layer 9a on the top of the convex portion 7a and the conductive thin layer 9b on the bottom of the concave portion 7b are electrically conductive. Therefore it is desirable to remove the conductive thin layer on the side surface of the convex portion 7a, which is very thin if produced, by carrying out etching for a short time.

EXAMPLES

Example 1

A Cr thin film layer of 300 nm thickness is formed on a glass substrate by a photoetching method, in a pattern of fine lines having a line width of 500 nm with a pitch of 1 μm, to make a pattern substrate for forming concave convex. An uncured transparent ultraviolet curing resin was sandwiched and laminated in between the pattern-side of this pattern substrate for forming a concave-convex and a polycarbonate film of 100 μm in thickness. This was exposed from the polycarbonate film side to cure the ultraviolet curing resin. Then by peeling the pattern substrate, a concave-convex pattern, with a width of the convex portion and a width of the concave portion of 500 nm and a height difference between the convex portion and the concave portion a 300 nm, is formed.

On the resulting concave-convex pattern, a Cu thin layer was formed on the top of the convex portion and the bottom of the concave portion in the concave-convex pattern by sputtering method such that the thickness of the Cu thin layer was 100 nm. Then, the concave-convex pattern was coated with a positive type photosensitive resin composition (trade name; "PMER P-LA900", manufactured by Tokyo Ohka Kogyo Co., Ltd.) by a spinner, heated at 80° C. for 30 minutes to form a layer of the positive type photosensitive resin composition having a thickness of 8 μm and a flat upper surface.

On the layer of the positive type photosensitive resin composition, the pattern substrate (concave-convex) was aligned so the pattern side was in contact with the layer of the positive type photosensitive resin composition, and also aligned with the same position on the polycarbonate film, as when the concave-convex pattern was formed, brought into close contact, and exposed to ultraviolet rays from the glass substrate side of the pattern substrate for forming concave-convex. After the exposure, developing was carried out using a developer (trade name; "PMER Dev P-7G", manufactured by Tokyo Ohka Kogyo Co., Ltd.) to remove the solubilized part which was the exposed part of the positive type photosensitive resin composition on the convex portion, thereby baring the thin layer of Cu on the convex portion. Utilizing this thin layer, electrolytic plating was carried out by using a copper sulfate plating bath to form a Cu plating layer of 3 μm thickness on the convex portion.

Thereafter, the side on which the Cu plating layer was formed was exposed to ultraviolet rays to solubilize the layer of the positive type photosensitive resin composition remaining in the concave portion, and the solubilized layer of the positive type photosensitive resin composition in the concave portion was removed by using a developer (trade name; "PMER Dev P-7G", manufactured by Tokyo Ohka Kogyo Co., Ltd.). Then, the resulting substrate was further dipped in an aqueous sodium persulfate solution (sodium persulfate; 20 g and HCl; 10 ml were contained in 1000 cm$^3$) for 3 minutes and in an aqueous potassium permanganate solution (potassium permanganate; 50 g and NaOH; 30 g were contained in 1000 cm$^3$) for 4 minutes to remove the Cu thin film on the bottom of the concave portion, thereby obtaining a conductive pattern substrate.

What is claimed is:

1. A method of manufacturing a conductive pattern substrate, comprising:

forming a concave-convex layer on a substrate by positioning a first substrate on a second substrate with a curing resin composition therebetween, curing the curing resin composition, and peeling the first substrate and the second substrate apart, wherein the second substrate includes a pattern layer defined by the presence or absence of a light shielding material, the first substrate and the second substrate are positioned such that the pattern layer faces the first substrate, and the concave-convex layer comprises concave portion corresponding to a portion of the pattern layer with the light shielding material and convex portion corresponding to a portion of the pattern layer without the light shielding material;

forming a conductive thin layer on the concave-convex layer by a gas phase method, the thin layer located on a top portion of the convex portion and on a bottom portion of the concave portion;

laminating a layer of photosensitive resin composition on the thin layer such that the concave-convex layer is flattened;

exposing the photosensitive resin layer via a light shielding pattern substrate having a pattern which is identical to the pattern layer of the pattern substrate;

developing the photosensitive resin layer to remove the photosensitive resin composition on either the at least one convex portion or the at least one concave portion, thereby baring a portion of the conductive thin layer; and forming a conductive pattern by plating the portion of the conductive thin layer with a metal.

2. The method of claim 1, wherein the photosensitive resin composition is of a positive type, and further comprising exposing and etching the photosensitive resin layer, after the step of forming the conductive pattern, to remove the photosensitive composition from the concave portion.

3. The method of claim 2, wherein the conductive thin layer is removed from the concave portion in addition to the photosensitive resin composition.

4. The method of claim 1, wherein the photosensitive resin composition is of a negative type, and further comprising exposing and etching the photosensitive resin layer, after the step of forming the conductive pattern, to remove the photosensitive composition from the convex portion.

5. The method of claim 4, wherein the conductive thin layer on the convex portion is also removed in addition to the removal of the photosensitive resin composition.

* * * * *